United States Patent [19]

Haferl

[11] 4,101,814
[45] Jul. 18, 1978

[54] SIDE PINCUSHION DISTORTION CORRECTION CIRCUIT

[75] Inventor: Peter Eduard Haferl, Adliswil, Switzerland

[73] Assignee: RCA Corporation, New York, N.Y.

[21] Appl. No.: 766,561

[22] Filed: Feb. 7, 1977

[30] Foreign Application Priority Data

Mar. 19, 1976 [GB] United Kingdom .............. 11271/76

[51] Int. Cl.² ............................................ H01J 29/56
[52] U.S. Cl. ................................................. 315/371
[58] Field of Search ........................ 315/370, 371, 403

[56] References Cited

U.S. PATENT DOCUMENTS 3,962,602  6/1976  Dietz .................................... 315/370

Primary Examiner—Maynard R. Wilbur
Assistant Examiner—T. M. Blum
Attorney, Agent, or Firm—Eugene M. Whitacre; Paul J. Rasmussen

[57] ABSTRACT

A horizontal deflection generator provides scanning current in a deflection winding and a pincushion modulating circuit is coupled to the deflection winding for modulating the horizontal scanning current. A vertical deflection generator and the horizontal deflection generator are coupled by means to the modulating circuit for providing vertical rate signals and nonlinear horizontal rate signals to the modulating circuit for providing a vertical rate distortion correction signal component modulated by the nonlinear horizontal rate signals for reducing the side pincushion distortion.

6 Claims, 6 Drawing Figures

SIDE PINCUSHION DISTORTION CORRECTION CIRCUIT

BACKGROUND OF THE INVENTION

This invention relates to side pincushion distortion correction circuits suitable for use in television receivers.

Pincushion distortion of a raster formed on the viewing screen of a cathode ray tube, such as the picture tube utilized in television receivers, is manifested by a bowing outwardly of the edges of the raster. This distortion is caused primarily by the curvature of the viewing screen. It is well known that side pincushion distortion may be reduced by modulating the horizontal rate scanning current flowing through the horizontal deflection coils at the vertical deflection rate. Usually the modulation is parabolic at the vertical rate so as to reduce the horizontal scan at the top and bottom portions relative to the horizontal center line of the raster. Known arrangements for effecting such modulation include placing secondary windings of a saturable reactor or transformer in circuit with the horizontal deflection coils and energizing the primary or control winding by a suitable parabolic vertical rate signal, or, directly controlling the amplitude of the scanning current by biasing the horizontal deflection stage or altering its operating voltage level at the vertical rate.

One arrangement for effecting side pincushion distortion correction is disclosed in U.S. application Ser. No. 722,600 filed Sept. 13, 1976 by Peter Eduard Haferl and entitled "Pincushion Correction Circuit" in which an inductance in series with the horizontal deflection coils is shunted by the series arrangement of a switch and a resonant circuit. The longer the switch is closed the greater the horizontal scanning current. The switch is controlled by a modulation in which a parabolic vertical rate signal is combined with linear, sawtooth-shaped horizontal rate signals for producing a train of horizontal rate signals pulse-width modulated at the vertical rate. The modulation is parabolic and results in a parabolic correction of the pincushion distortion.

However, it has been determined that, depending on such factors as the geometry of the picture tube, a horizontal scanning current modulation other than parabolic may be required to minimize side pincushion distortion.

SUMMARY OF THE INVENTION

A side pincushion distortion correction circuit includes a horizontal deflection generator coupled to a horizontal deflection winding for supplying scanning current thereto. A pincushion distortion correction modulator is coupled to the deflection winding and is responsive to a vertical deflection rate signal. Means couple the horizontal deflection generator to the modulator for providing nonlinear horizontal rate signals for providing a combined vertical rate and nonlinear horizontal rate modulation of the scanning current for reducing side pincushion distortion.

DESCRIPTION OF THE INVENTION

Figure 2:
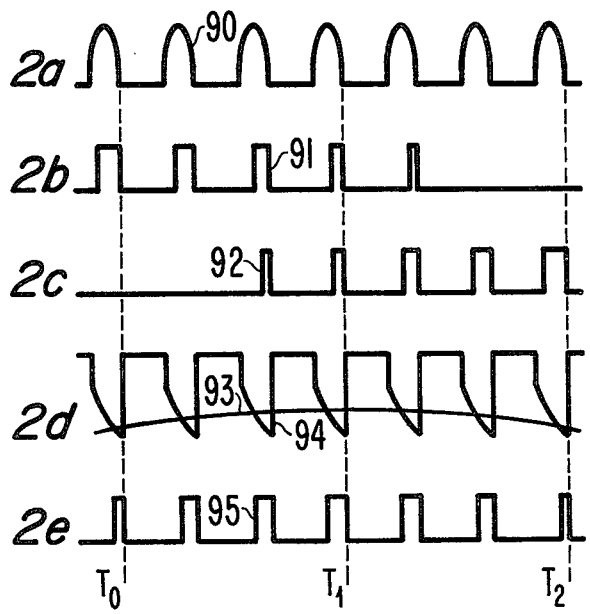
FIGS. 2a-2e illustrate various waveforms obtained in the system of FIG. 1.

A vertical oscillator and sawtooth generator 26 receives vertical sync pulses from a source, not shown, and produces vertical sawtooth waves 99 which are coupled to a modulator 27. Modulator 27 produces two pulse trains 91 and 92 as illustrated in FIGS. 2b and 2c, respectively, which are coupled to the gate electrodes of respective SCR's 28 and 31. SCR's 28 and 31 are serially coupled with a secondary winding 11b of a horizontal output transformer 11, an inductor 29, an inductor 32, another secondary winding 11c and ground. The junction of the cathode of SCR 28 and inductor 32 is coupled to one terminal of a capacitor 30. In parallel with capacitor 30 is the series connection of a vertical deflection winding 33 and a feedback resistor 34. The feedback signal is coupled from resistor 34 to an input terminal of modulator 27. Generally sawtooth-shaped horizontal rate pulses 96 obtained from a sawtooth generator 40 are coupled to another input terminal of modulator 27.

A horizontal deflection generator 10 is coupled to a source of horizontal sync pulses, not shown, and to a primary winding 11a of horizontal output transformer 11. A horizontal deflection rate sawtooth scanning current is coupled through an S-shaping capacitor 12, parallelly coupled deflection coils 13, a linearity inductor 14 to a tap 16 and through a winding 17a of pincushion modulator network 15 to ground. A winding 17b is coupled to tap 16 and damping resistor 18 shunts windings 17a and 17b. In parallel with windings 17a and 17b and resistor 18 is a series arrangement of a capacitor 19 and a parallel switch 20 comprising an SCR 22 and a diode 21 poled for conducting current in opposite directions. An inverting and driver transistor 80 has its collector coupled to the gate electrode of SCR 22 and through a load resistor 82 to ground. Its emitter is coupled through a resistor 81 to a source of positive operating potential and its base is coupled to a modulator circuit 60.

Generally, the vertical deflection circuit extending to the left of transformer 11 is of the type described in U.S. application Ser. No. 595,809, filed on July 14, 1975, by Peter Eduard Haferl and entitled "Switched Vertical Deflection System."

The aforementioned pincushion modulator circuit 15 which provides for side pincushion distortion correction is of a type described in the above-mentioned U.S. application Ser. No. 722,600. Reference is made to the above-identified two applications for a complete detailed operation of the vertical deflection and pincushion circuits but a brief description thereof follows.

In modulator 27 of the vertical deflection circuit sawtooth waveform 99 is processed and a negative-going counterpart thereof is also developed. Horizontal rate generally sawtooth-shaped waveforms 97 including a pedestal component are applied to two modulating stages to which a respective one of the positive and negative sawtooth vertical rate deflection waveforms are applied. These stages produce two trains of width modulated waveforms similar to the waveforms 91 and 92 of FIGS. 2b and 2c. It is noted that waveforms 91 are wider at a beginning portion of the vertical deflection interval represented by time $T_0$ and get narrower as they approach the center of the vertical interval $T_1$. Conversely, waveforms 92 are widest near the end of the vertical trace interval represented by time $T_2$ and are increasingly narrower as they approach the center of the vertical interval $T_1$. The pedestal level of the waveform 96 applied to the modulator 27 may be adjusted so that the waveform trains 91 and 92 overlap to any desired degree.

The waveform trains 91 and 92 are coupled to the SCR switches 28 and 31. It is noted that the trailing edges of waveforms 91 and 92 are coincident with the trailing edges of horizontal retrace pulses 90 of FIG. 2a such as are obtained from horizontal output transformer 11. Thus, during the first half portion of each vertical trace interval SCR 28 is enabled for conduction by waveforms 91. SCR 28 conducts horizontal retrace pulse energy from winding 11b through inductance 29 to charge capacitor 30 in a resonant manner as determined primarily by inductance 29 and capacitor 30. Current stops flowing following the end of each horizontal retrace interval when the resonant charging current reverses and shuts off SCR 28. In a similar manner, capactor 30 is charged to the opposite polarity during the second half of the vertical trace interval by the conduction of horizontal retrace pulse energy through capacitor 30, inductor 32, winding 11c and SCR 31 to ground. Thus, during the first half of the vertical trace interval, capacitor 30 is charged to a first polarity with decreasing amounts of horizontal rate energy and during the second half of the vertical trace, capacitor 30 is charged in the opposite polarity with increasing amounts of horizontal retrace energy. The horizontal rate sawtooth voltage across capacitor 30 is integrated into a vertical rate sawtooth current as capacitor 30 discharges through deflection windings 33 and feedback resistor 34 to ground. The discharge of capacitor 30 provides the vertical deflection rate scanning current.

Side pincushion distortion correction circuit 15 operates generally as follows. Winding 17a is in series with horizontal deflection coils 13 and provides a relatively high impedance to the horizontal scanning current. Inductance 17b and capacitor 19 are coupled through switch 20 to ground to form a parallel path for scanning current when switch 20 is closed. SCR 22 of switch 20 is gated into conduction by horizontal rate waveforms 95 of FIG. 2e which are of relatively short duration at the beginning of vertical scan, $T_0$, increase to a maximum at the center of the vertical scan period, $T_1$, and decrease to a minimum at the end of scan, $T_2$. Generally, as will be described in more detail below, the width modulation of waveforms 95 is parabolic at the vertical deflection rate. Thus, the impedance of pincushion modulator 15 circuit to the horizontal scanning current is maximum at the beginning and end of the vertical trace interval and minimum at the center, thereby reducing the horizontal scan width at the top and bottom of the raster relative to the center in a manner to reduce side pincushion distortion.

The non-linear horizontal sawtooth generator 40 includes an inverting pulse amplifier 43 having its base connected through a resistor 41 to a source of positive-going horizontal retrace pulses obtained from a winding 11d of horizontal output transformer 11. The base is coupled through a resistor 42 to ground. The collector electrode is coupled through a load resistor 44 to a source of positive potential and through a resistor 45 to the base of a switch transistor 47 which has its base coupled to ground through a resistor 46. A reactive charging circuit includes a resistor 48 and a capacitor 49 serially coupled between a source of positive potential and ground. The junction of these components is coupled through a resistor 54 and a diode 55 to the collector of transistor 47. The junction of elements 48, 49 is also coupled through a resistor 50 to a capacitor 52, a potentiometer 51 and a diode 53 to the collector of transistor 47. The junction of potentiometer 51 and diode 53 is coupled to an input terminal of modulator 27.

During operation, near the end of each horizontal trace period in the absence of horizontal retrace pulses, transistor 43 is cutoff and transistor 47 is biased for conducting in saturation. Capacitor 49 had discharged earlier in the trace period and now a first direct current flows from the positive supply through resistors 48, 54, diode 55 and transistor 47 to ground. A second direct current flows from the positive supply through resistors 48, 50, potentiometer 51, diode 53 and transistor 47 to ground. These direct currents establish respective direct voltages across capacitor 49 and 52 for establishing a pedestal level for the respective pulses 98 and 97 produced by the generator during the horizontal retrace period. Potentiometer 51 is adjustable to vary the pedestal level of the pulses 97 coupled to modulator 27 for determining the degree of overlap of the two pulse trains 91 and 92 of FIGS. 2b and 2c as described above.

At the beginning of the horizontal retrace interval, the positive-going retrace pulse causes transistor 43 to conduct which in turn cuts off transistor 47. Diodes 53 and 57 can no longer conduct current. The voltage at the junction of resistor 54 and diode 55 suddenly increases to the pedestal level which was previously established across capacitor 49. Capacitor 49 now charges positively from the B+ supply through resistor 48 which acts as a current source. This produces at the junction of resistor 54 and diode 55 a non-linear exponential positive-going portion of waveform 98 sitting on top of the pedestal level which was previously established across capacitor 49.

Similarly, during the horizontal retrace interval, capacitor 52 starts to charge positively from its established positive voltage level from the positive supply through resistors 48 and 50. Pulse 97 is developed across capacitor 52 and this pulse, with its positive voltage level established by the setting of potentiometer 51, is coupled to modulator 27. At the end of the horizontal retrace period transistor 43 is cutoff and switch transistor 47 once again conducts providing a quick discharge path for capacitors 49 and 52 through respective diodes 55 and 53.

The values of resistors 48 and 50 and capacitors 49 and 52 are selected to give a desired degree of nonlinearity to the pulses 97 and 98 as will be explained below.

Nonlinear horizontal rate pulses 98 are coupled from generator 40 through a resistor 65 to the base of transistor 64 in a modulating circuit 60. A resistor 63 is coupled between the base and emitter electrodes of transistor 64 and the junction of series coupled resistor 61 and potentiometer 62 is coupled to the emitter of transistor 64 for biasing this transistor. A feedback resistor 67 is coupled between the collector and base of transistor 64 and a load resistor 66 is coupled between a positive supply and the collector of transistor 64, the collector also being coupled to the base electrode of transistor 68 of a differential comparator comprising the transistors 68 and 69. The emitters of transistors 68 and 69 are commonly coupled to ground through a resistor 70. A load resistor 71 is coupled between the positive potential source and the collector of transistor 69, the latter junction being coupled to the base of transistor 80.

The positive-going vertical rate sawtooth waveform 99 obtained from the vertical oscillator and sawtooth generator 26 is coupled to a coupling and amplitude control network comprising capacitor 72, potentiometer 73 and resistor 74 to the base of a transistor 77. A resistor 78 is coupled between the base and emitter electrodes of transistor 77 with the emitter side coupled to ground. The collector of transistor 77 is coupled to one side of a capacitor 76, one side of a resistor 75, to the base of transistor 69 and through a load resistor 79 to the source of positive potential. Resistor 75 and 78 bias the base of transistor 77 and determine the average collector current thereof. Resistor 75 provides a negative feedback for transistor 77 to increase its stability of operation. Capacitor 76, which provides a feedback between the collector and base of transistor 77, serves to integrate the vertical rate sawtooth 99 which appears at the base of transistor 69 as illustrated by parabolic waveform 93 of FIG. 2d.

In operation of the modulation circuit 60 positive-going horizontal rate pulses 98 occurring within each horizontal retrace period are inverted by transistor 64 and appear at the base of transistor 68 of the comparator as illustrated by the pulse waveform 94 of FIG. 2d. When the level of the non-linear horizontal rate pulses 94 coupled to the base of transistor 68 falls below the level of the parabolic vertical rate waveform 93 coupled to the base of transistor 69, transistor 69 conducts and produces a series of width-modulated pulses which are coupled through transistor 80 and appear at the gate electrode of SCR 22 as illustrated by the pulse waveform 95 of FIG. 2e. Potentiometer 62 can vary the average DC voltage of the horizontal rate pulses 98 coupled to the base of transistor 64 which in turn varies the level of the intersection points of waveforms 93 and 94 in FIG. 2d. This adjustment in turn varies the width of pulses 95 and hence controls the width of the raster via the pincushion correction circuit.

With reference to FIGS. 2d and 2e, it can be seen that the width of each SCR gating pulse 95 is determined by the shape and amplitude of the vertical rate parabolic voltage 93 as well as the shape and amplitude of the nonlinear horizontal rate pulses 94. Relative to a linear sawtooth shaped pulse, the non-linear pulses 94 provide an extra degree of modulation of gating pulses 95. This in turn enables the switch 20 of pincushion modulator 15 to operate such that the horizontal scanning current can be modulated with this extra time modulation, thereby enhancing the ability of the pincushion distortion correction circuit to correct for side pincushion distortion as it appears on various types of television picture tubes.

Figure 1:
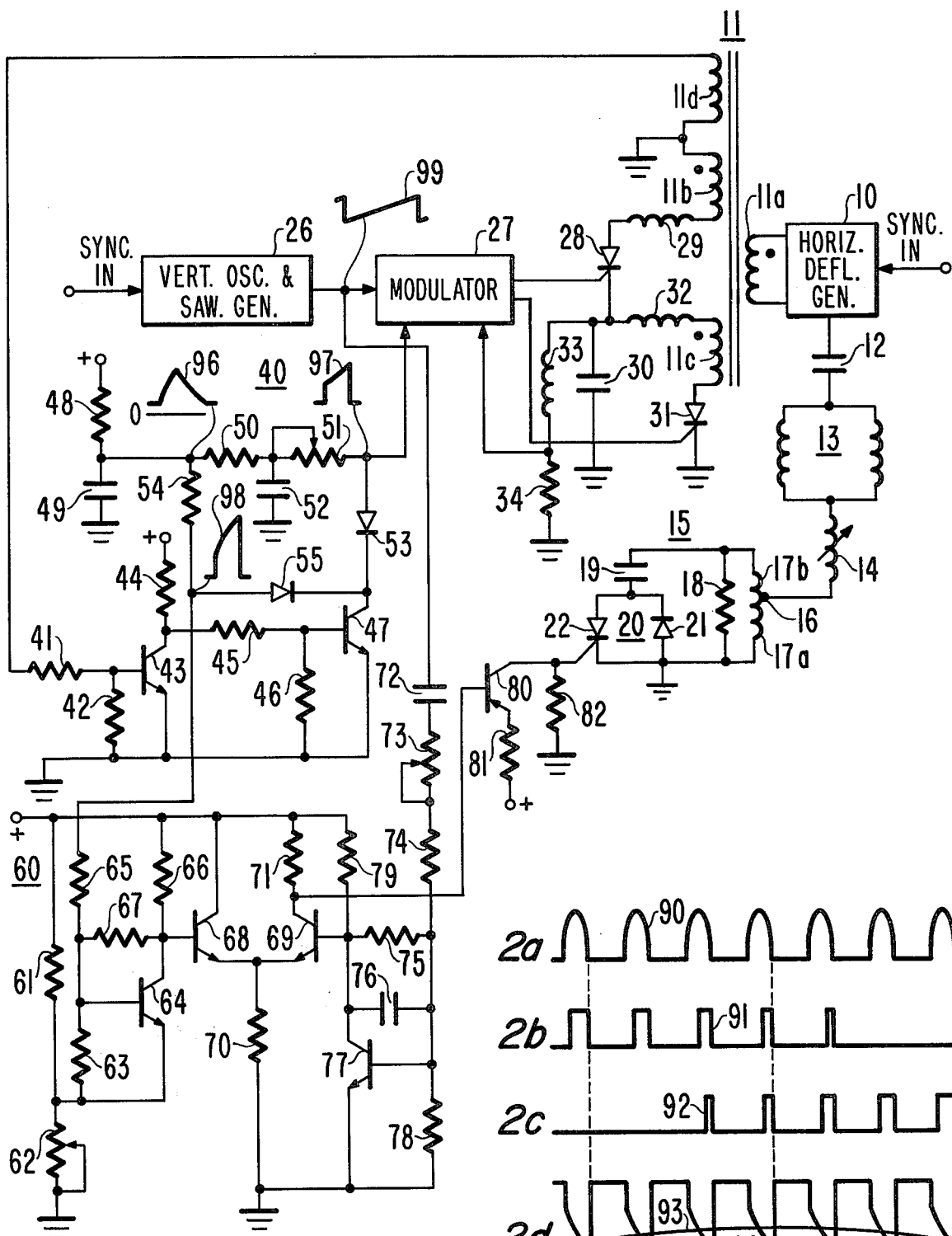
FIG. 1 is a block and schematic circuit diagram of a deflection system embodying a side pincushion distortion correction circuit in accordance with the invention.

The following is a listing of component values for some of the circuit elements utilized in FIG. 1.

| R41 | 10kΩ | C49 | 0.01µf |
| R42 | 4.7kΩ | C52 | 4700µµf |
| R44 | 4.7kΩ | C72 | 1µf |
| R45 | 4.7kΩ | C76 | 0.47µf |

-continued

| R46 | 4.7kΩ |
| R48 | 2.2kΩ |
| R50 | 10kΩ |
| R51 | 10kΩ |
| R54 | 330Ω |
| R73 | 220kΩ |
| R74 | 10kΩ |
| R78 | 5.6kΩ |

What is claimed is:

1. A side pincushion distortion correction circuit, comprising:
   a horizontal deflection winding;
   a horizontal deflection generator coupled to said deflection winding for supplying scanning current thereto;
   scanning current modulating means including a controllable switch coupled to said deflection winding;
   a vertical deflection generator;
   means coupling said vertical generator to said modulating means for controlling said switch for providing modulation of said scanning current at said vertical rate; and
   means coupling said horizontal generator to said modulating means for producing nonlinear horizontal rate signals for controlling said switch for providing a combined nonlinear horizontal rate and a vertical rate modulation of said scanning current in a manner for reducing said side pincushion distortion.

2. A side pincushion distortion correction circuit according to claim 1 wherein said means coupling said vertical generator to said modulating means includes means for producing a nonlinear vertical rate signal for providing a nonlinear modulation of said scanning current at said vertical rate.

3. A side pincushion distortion correction circuit according to claim 2 wherein said means coupling said vertical generator to said modulating means includes means for producing a generally parabolic vertical rate signal for providing a generally parabolic modulation of said scanning current at said vertical rate.

4. A side pincushion distortion correction circuit according to claim 1 wherein said means coupling said horizontal generator to said modulating means includes means for producing horizontal rate waveforms having an exponential shape.

5. A side pincushion distortion correction circuit according to claim 4 wherein said means coupling said horizontal generator to said modulating means includes switching means responsive to said horizontal rate signals, said switching circuit being coupled to a reactive charging circuit for producing said exponential shape horizontal rate signals.

6. A side pincushion distortion correction circuit according to claim 5 wherein said switching means is responsive to horizontal rate retrace pulses obtained from said horizontal generator for producing said exponential shape horizontal rate signals having a width substantially equal to the width of said horizontal retrace pulses.

* * * * *